United States Patent
Perry et al.

(10) Patent No.: US 10,418,905 B1
(45) Date of Patent: Sep. 17, 2019

(54) PRE-BIAS CONTROLLER FOR SWITCHING POWER CONVERTERS

(71) Applicant: Raytheon Company, Waltham, MA (US)

(72) Inventors: Marty Perry, Tucson, AZ (US); Robert J. Schaller, Tucson, AZ (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 16/202,574

(22) Filed: Nov. 28, 2018

(51) Int. Cl.
| | | |
|---|---|---|
| H02M 1/36 | (2007.01) | |
| H02M 3/158 | (2006.01) | |
| H02M 1/088 | (2006.01) | |
| H02M 1/00 | (2006.01) | |
| H02M 3/156 | (2006.01) | |
| H02M 3/335 | (2006.01) | |

(52) U.S. Cl.
CPC ......... H02M 3/1588 (2013.01); H02M 1/088 (2013.01); H02M 1/36 (2013.01); H02M 3/156 (2013.01); H02M 3/33592 (2013.01); H02M 2001/0048 (2013.01)

(58) Field of Classification Search
CPC ........... H02M 3/33592; H02M 3/1588; H02M 1/088; H02M 2001/0048; H02M 2001/0016; H02M 2001/0025; H02M 1/14; H02M 1/143; H02M 1/15; H02M 1/38; H02M 2001/385; H02M 3/156; H02M 3/1563; H02M 2003/1566; H02M 1/36
See application file for complete search history.

(56) References Cited

U.S. PATENT DOCUMENTS

| | | | | |
|---|---|---|---|---|
| 8,242,762 | B2* | 8/2012 | Bhagwat | H02M 3/1588 307/152 |
| 8,358,117 | B1* | 1/2013 | Chui | H02M 3/1563 323/224 |
| 8,963,520 | B1* | 2/2015 | Leone | H02M 1/36 323/271 |
| 2010/0013307 | A1* | 1/2010 | Heineman | G06F 1/26 307/33 |
| 2011/0316518 | A1* | 12/2011 | Feng | H02M 3/156 323/349 |
| 2015/0326120 | A1* | 11/2015 | Kelin | H02M 3/158 323/282 |
| 2018/0013348 | A1* | 1/2018 | Paul | H02M 3/1584 |

* cited by examiner

*Primary Examiner* — Alex Torres-Rivera
(74) *Attorney, Agent, or Firm* — Eric A. Gifford

(57) ABSTRACT

A pre-bias control circuit for a switching power converter detects the slope of the output voltage over time and outputs an OPEN command when the slope detected is more NEGATIVE than a pre-defined threshold and a pre-charge current that flows back through the switching power converter has reached a maximum value. In response, the synchronous rectifier switch OPENs overriding the typical control waveform to control the energy from the output voltage from flowing back through the switching power converter. The switching power converter may be any converter that includes a synchronous rectifier, such as a flyback converter, a forward converter, a buck converter, in a single-ended, double-ended and/or multi-phased configuration.

22 Claims, 7 Drawing Sheets

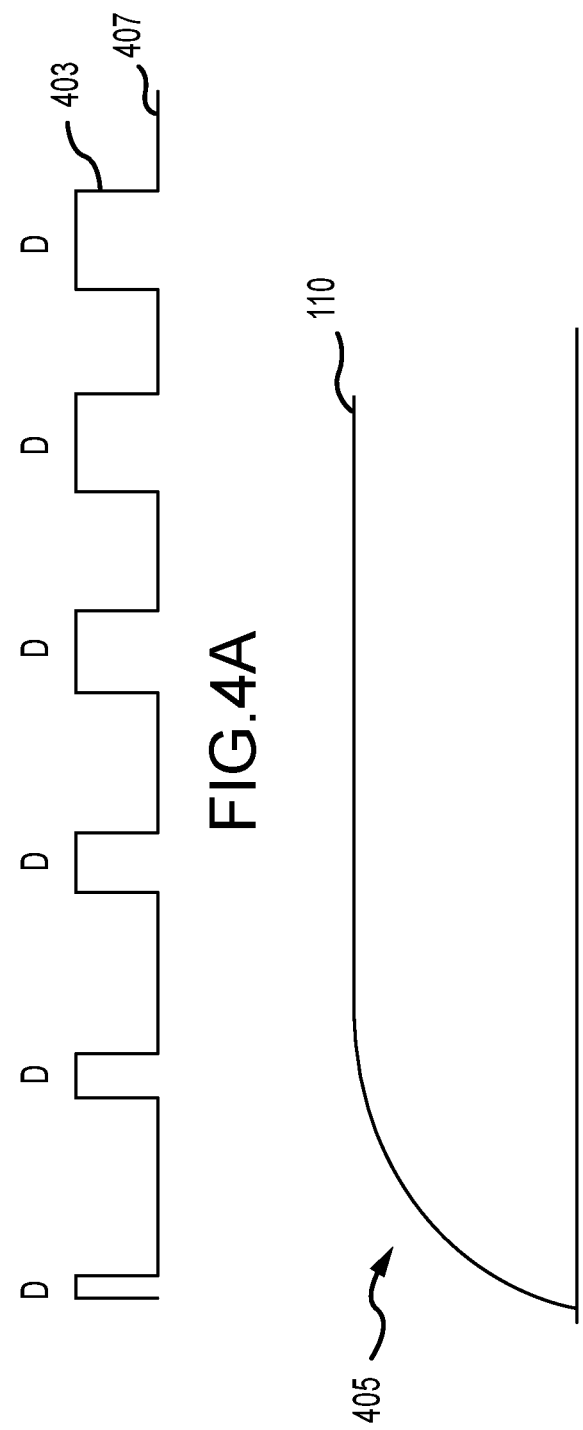

PRE-BIAS CONTROLLER FOR SWITCHING POWER CONVERTERS

BACKGROUND OF THE INVENTION

Field of the Invention

This invention relates to circuits for controlling the operation of synchronous rectifiers during pre-bias conditions.

Description of the Related Art

Switching power converters are currently used in numerous applications of power systems. These converters are devices that convert a direct current (DC) input voltage into a predetermined DC output voltage. A typical switching power converter has an energy storage section, a switching control circuit such as a pulse width modulator (PWM), a primary switch, and a rectifier. The energy storage section is responsive to the selective application of the input voltage to produce a current and the output voltage. The switching control circuit, primary switch and rectifier control the application of the input voltage to the energy storage section to set the value of the output voltage.

Synchronous rectification has become a desirable alternative to passive rectifiers in power converters due to the increased power conversion efficiency that results at least in part from reduced power losses and higher density. However, while diodes only permit current flow in one direction, synchronous rectifiers such as MOSFETs, or other equivalent semiconductor switches permit current flow in either direction In a typical buck converter, the primary switch and synchronous rectifier control the transfer of energy in response to the switching control circuit, which produces a waveform that toggles between HIGH and LOW at a duty cycle to set the value of the output voltage. During normal or steady state operation, the switch and rectifier are in opposition to each other and respond to the waveform such that when the primary switch is CLOSED and the synchronous rectifier is OPEN the energy storage section is charging and when the primary switch is OPEN and the synchronous rectifier is CLOSED the energy storage section is discharging the output.

A problem common in many switching power converters employing synchronous rectification is therefore the drawing of current from a pre-existing voltage, or pre-biased output voltage, also known as reverse bias or back bias, during certain sequences such as startup or shutdown conditions. Pre-biased voltage may come from other power sources in a non-isolated system, or may come from a load. During a soft-start condition, the synchronous rectifiers may have a high duty ratio for the duration of the output voltage rise time of the power supply. Where a pre-biased voltage exists, a reverse current may exist, which may cause the output voltage to drop and correspondingly disturb other elements in the system.

U.S. Pat. No. 6,618,274 entitled "Synchronous rectifier controller to eliminate reverse current flow in a DC/DC converter output" discloses a control scheme for a synchronous rectifier converter that prevents substantial reverse current flow in all modes of operation without disabling the synchronous rectifiers. Rather than disable the synchronous rectifier altogether to stop the flow of reverse current in light-load, startup, or shutdown conditions, the secondary synchronous rectifier is always enabled, operating either in the fully-synchronous mode or the partially-synchronous mode. The transition between the two operating modes is determined by sensing a system parameter. For example, this parameter can be based on the amount of reverse current that would disrupt the bus to which the converter output is connected, or it could be based on the heat created by the reverse current flow in the power converter when heat dissipation is a concern. In the partially synchronous mode, a duty cycle of the synchronous rectifier switch is modified to turn off the synchronous rectifier before the output current goes negative. The control scheme effectively limits substantial reverse current flow while also improving efficiency by eliminating the need for discrete diodes, yet retaining the benefit of synchronous rectification throughout the operating range of the converter.

U.S. Pat. No. 6,912,138 entitled "Synchronous rectifier control circuit" discloses a synchronous rectifier control circuit for controlling a synchronous rectifier of a power converter. In one embodiment, the conduction of the synchronous rectifier is controlled in proportion of the differentiated output voltage. This embodiment involves increasing the rate of a voltage level of the control signal to the synchronous rectifier.

U.S. Pat. No. 8,373,403 entitled "Circuit for Controlling Synchronous Rectifiers During Start-up into Pre-Bias Output Voltage" discloses a power supply that includes circuitry for gradually enabling switching rectifiers dining a startup condition without drawing current from a pre-biased power supply output. A driver provides a control signal to a synchronous rectifier. A driver supply circuit is coupled across the driver and has a first input receiving pulse signals provided by a pulse modulation controller, an output providing supply voltage to the driver, a second input receiving driver supply input voltage, and circuitry defining a time constant. The circuitry includes a first switching element that turns on when pulse signals are provided and a second switching element connected to the output. The time constant is associated with a rise time for the power supply, and defined by selected component values, such that the second switching element only becomes fully conductive after elapsing of the time constant.

SUMMARY OF THE INVENTION

The following is a summary of the invention in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description and the defining claims that are presented later.

The present invention provides a pre-bias control circuit for a switching power converter that detects the slope of the output voltage over time and outputs an OPEN command when the slope detected is more NEGATIVE than a predefined threshold and a pre-charge current that flows back through the switching power converter has reached a maximum value. In response, the synchronous rectifier switch OPENs overriding the typical control waveform to control the energy from the output voltage flowing back through the switching power converter.

In one embodiment, the pre-bias control circuit has an AND gate to determine the control of the synchronous rectifier In one embodiment, the pre-bias control circuit has a slope measurement circuit and a slope detection circuit.

In one embodiment, the slope measurement circuit includes a slope amplification circuit.

In one embodiment, the pre-defined threshold is set such that the pre-bias control circuit is controlled and non-responsive to noise.

The switching power converter may be any converter that includes synchronous rectifiers, such as a flyback converter, a forward converter, a buck converter, in a single-ended, double-ended and/or multi-phased configuration.

These and other features and advantages of the invention will be apparent to those skilled in the art from the following detailed description of preferred embodiments, taken together with the accompanying drawings, in which:

BRIEF DESCRIPTION OF THE DRAWINGS

FIGS. 4a and 4b are waveform diagrams illustrating the normal operation of a switching power converter of FIG. 3 according to one embodiment of the present invention;

DETAILED DESCRIPTION OF THE INVENTION

It is to be understood that the figures and descriptions of the present invention have been simplified to illustrate elements that are relevant for a clear understanding of the present invention, while eliminating, for purposes of clarity, other elements of a conventional power converter. For example, certain power converters require a transformer reset mechanism. However, such reset mechanisms are not described herein. Those of ordinary skill in the art will recognize, however, that these and other elements may be desirable in a typical power converter. However, because such elements are well known in the art, and because they do not facilitate a better understanding of the present invention, a discussion of such elements is not provided herein.

All circuit components are assumed ideal for the purpose of describing the present invention. In addition, as used herein, the term "ON" is used synonymously with "CLOSED," and the term "OFF" is used synonymously with "OPEN" when referring to the state of a semiconductor switch. Also, as used herein, a semiconductor switch is "ON" when the switch reaches a low-impedance state after the control signal to the switch reaches a suitable voltage level to initiate turn-on of the switch. Similarly, a switch is "OFF" when the switch reaches a high-impedance state after the control signal reaches a suitable level to initiate turn-off of the switch. Additionally, as used herein, a slope is "NEGATIVE" relative to the polarity of the output voltage. For example, if the output voltage is +5V or 5 volts in the positive direction, the "NEGATIVE" slope would be in the negative direction. Alternatively, if the output voltage is a −5V or 5 volts in the negative direction, the "NEGATIVE" slope would be in the positive direction. In addition, as used herein, a waveform is "HIGH" when the signal is ON or producing a logic "1". Similarly, a signal or waveform is "LOW" when the signal is OFF or producing a logic "0".

During normal conditions, the primary switch and the synchronous rectifier switch operate in opposition to each other to charge and discharge the energy storage section to produce the desired output voltage from the input voltage. However, during pre-bias conditions, there is a potential to disturb or damage components of the switching power converter with uncontrolled current flowing back into the converter. To limit the current flow back into the power converter, the pre-bias control circuit overrides the commanded state of the synchronous rectifier switch in order to control the discharging of the energy storage section by holding the synchronous rectifier switch OPEN as current and voltage conditions are met.

Figure 1:
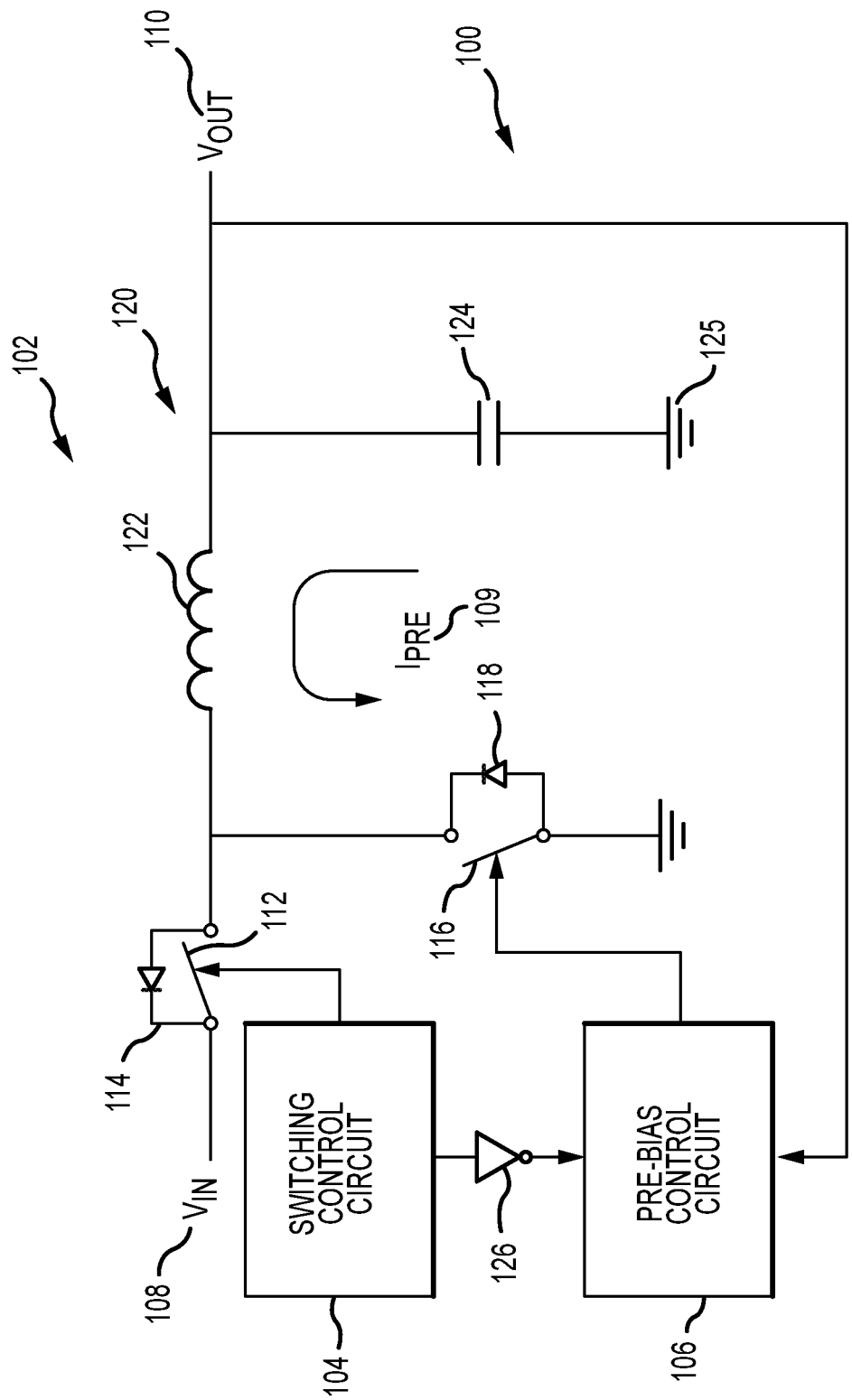
FIG. 1 is a diagram of a switching power converter according to one embodiment of the present invention.

Referring now to FIG. 1, one embodiment of the switching power converter 100 includes a buck converter 102, a switching control circuit 104 and a pre-bias control circuit 106.

The switching control circuit 104 creates a waveform that controls the switching frequency of the switching power converter 100. The waveform is rectangular having a period and a duty cycle. The frequency of the switching power converter 100 is equal to the inverse of the period. The output voltage (Vout) 110 is the result of the input voltage (Vin) 108 multiplied by the duty cycle. In one embodiment, the switching control circuit 104 may be configured to include a pulse width modulator (PWM) integrated chip. In another embodiment, the switching control circuit 104 may include an internal clock that sets the duty cycle or operating frequency of the switching power converter. In another embodiment, the switching control circuit 104 may include an error amplifier in combination with the PWM integrated chip.

The buck converter is a typical DC-DC switching power converter that steps down voltage while stepping up current from the input voltage 108 to the output voltage 110. The illustrated buck converter 102 includes a primary switch 112 showing the ideal intrinsic body diode 114, a synchronous rectifier switch 116 showing the ideal intrinsic body diode 118, and an energy storage section 120. The energy storage section 120 in a buck converter 102 includes an inductor (Lo) 122 and an output capacitor (Cout) 124. The primary switch 112 has an input, an output and a control. The input of the primary switch 112 is connected to the input voltage 108, the output is connected to the input of the inductor 122 and the control is connected to the output of the switching control circuit 104. The synchronous rectifier switch 116 has an input, an output and a control. The input of the synchronous rectifier switch 116 is connected to ground 125, the output is connected to the input of the inductor 122 and the control is connected to the output of the pre-bias control circuit 106. The pre-bias control circuit 106 has two inputs and an output. The first input of the pre-bias control circuit 106 is connected to the output of the switching control circuit 104 through an inverter 126. The second input of the pre-bias control circuit 106 is connected to the output voltage 110. The function of the pre-bias control circuit 106 will be described below.

During normal operation the primary switch 112 and the synchronous rectifier switch 116 operate in opposition to each other responsive to the output of the switching control circuit 104 such that when the primary switch 112 is CLOSED and the synchronous rectifier switch 116 is OPEN the energy storage section 120 is charging responsive to the application of the input voltage 108 such that the inductor 122 will have a voltage impressed across it equal to (Vin−

Vout). With a constant voltage across the inductor 122, its current increases. When the primary switch 112 is OPEN and the synchronous rectifier switch 116 is CLOSED the energy storage section 120 is discharging such that the voltage polarity across the inductor 122 immediately reverses trying to maintain the previous current. Since the polarity of the inductor 122 is reversed, the current will ramp down until the switching control circuit 104 commands the switches 112, 116 again such that the voltage and current flow within the circuit is controlled.

However, during pre-bias conditions, the switching control circuit 104 will command the synchronous rectifier switch 116 CLOSED while the output voltage 110 is greater than the input voltage 108. At this time, the inductor's 122 current is flowing back through the circuit as the voltage polarity across the inductor 122 is reversed. While the output voltage 110 is greater than the input voltage 108, this pre-charge current (Ipre) 109 is uncontrolled by the switching control circuit 104 or the energy storage section 120 but is controlled by the pre-bias control circuit 106 as described below. The maximum pre-charge current (Ipremax) value can be calculated with the circuit's parameters as shown in the following equation:

$$\left( Ipremax = \frac{Vout}{\sqrt{\frac{Lo}{Cout}}} \right).$$

The pre-bias control circuit 106 detects the slope of the output voltage 110 over time (rate of change) and produces an OPEN command when the slope detected is more NEGATIVE than a pre-defined threshold and the pre-charge current 109 has reached the maximum value, Ipremax, the synchronous rectifier switch 116 responds to the OPEN command and overrides the output of the switching control circuit 104 by commanding the synchronous rectifier switch 116 OPEN to control the energy from the output capacitor 124 flowing back through the switching power converter 100. The pre-bias control circuit 106 is continually monitoring the output voltage 110, pre-charge current 109 and overriding the switching control circuit 104 as the more NEGATIVE slope is detected while reaching the maximum pre-charge current of the switching power converter.

Figure 2:
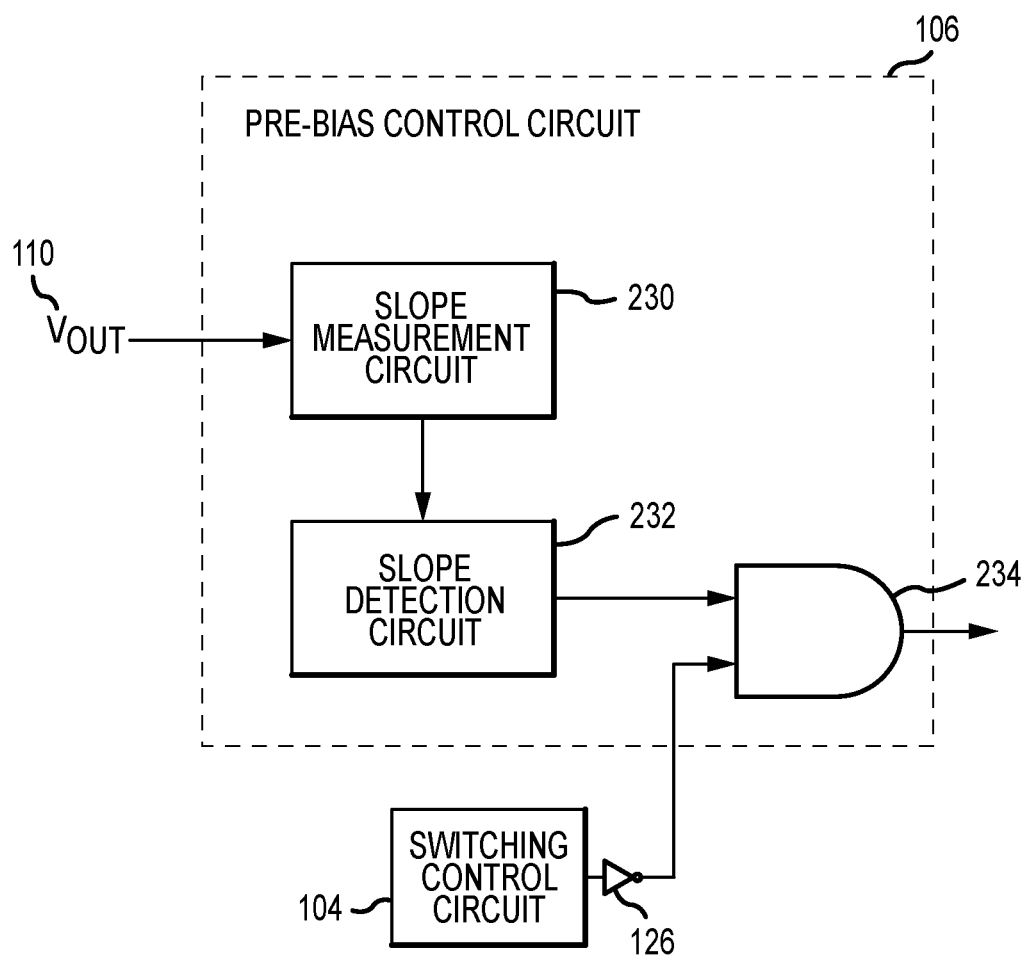
FIG. 2 is a diagram of a pre-bias control circuit of FIG. 1 according to one embodiment of the present invention.

FIG. 2 is a schematic of the pre-bias control circuit 106 of FIG. 1 according to one embodiment of the present invention. The pre-bias control circuit 106 may control one or more synchronous rectifier switches of a switching power converter. In one embodiment of the present invention, the illustrated pre-bias control circuit 106 includes a slope measurement circuit 230, a slope detection circuit 232, an inverter 126 and a rectifier gating circuit 234, in this case an AND gate 234. The slope measurement circuit 230 differentiates the output voltage 110 of the switching power converter over time. The slope detection circuit 232 is responsive to the output of the slope measurement circuit 230 by generating a logic '0' when a NEGATIVE slope is detected with a value more negative than a pre-defined threshold voltage and the pre-charge current 109 has reached the maximum value; and a logic '1' when a non-NEGATIVE slope is detected with a value more positive than a pre-defined threshold voltage without reaching the maximum pre-charge current of the switching power converter. By using the logic AND gate 234, the output of the slope detection circuit 232 overrides the switching control circuit 104 waveform, such that the output of the pre-bias control circuit 106 will be a logic "1" when the switching control circuit 104 waveform is LOW and the slope detection circuit output is a logic "1". The output of the pre-bias control circuit 106 will be a logic "0" if either the switching control circuit 104 waveform is HIGH or the slope detection circuit output is a logic "0". In another embodiment, the output of the slope measurement circuit 230 is amplified and filtered to remove noise before being used by the slope detection circuit 232. In another embodiment, the gating rectifier circuit is a combination of multiple logic gates with one output controlling the synchronous rectifier switch.

Figure 3:
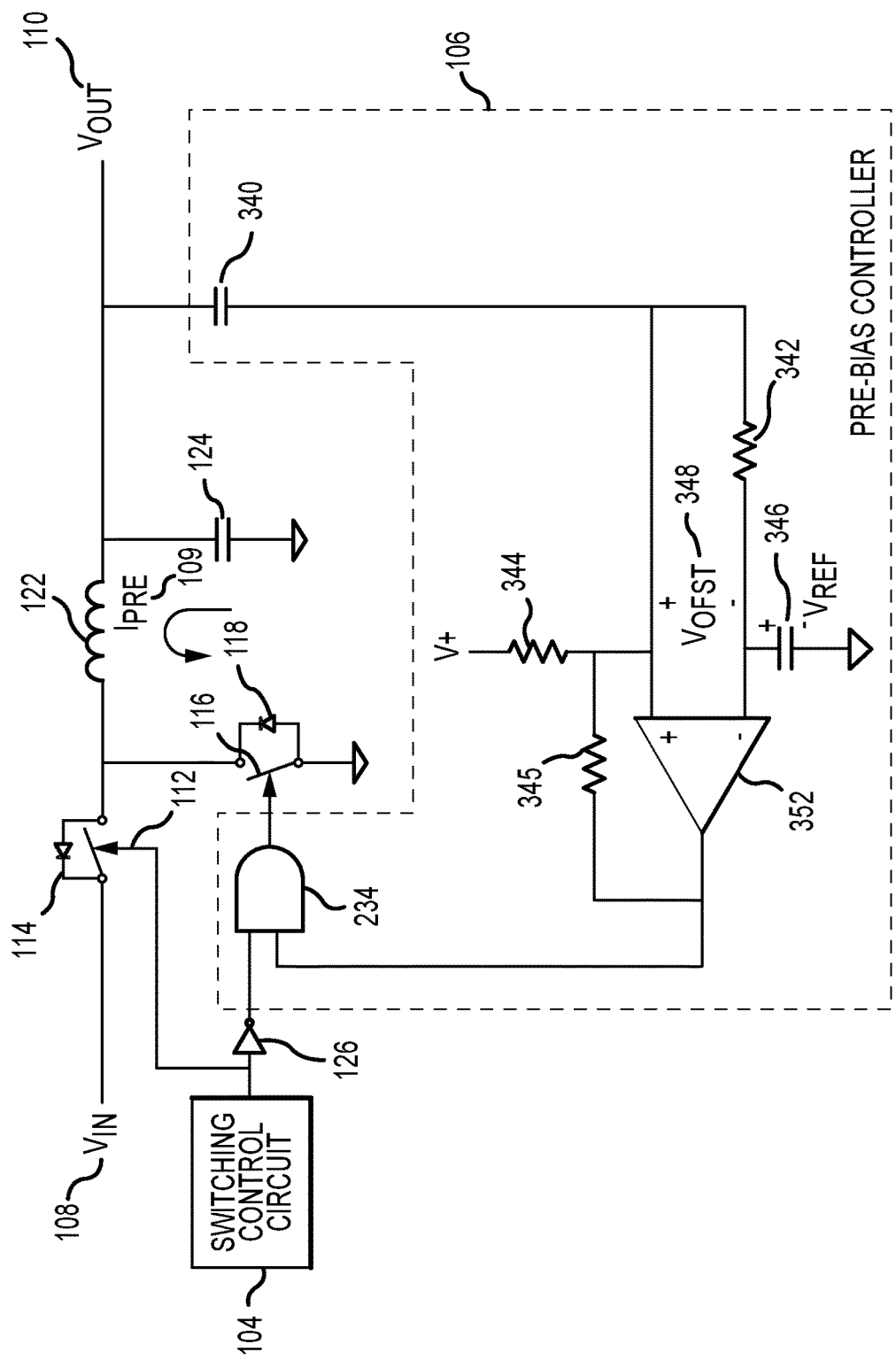
FIG. 3 is a diagram of a switching power converter with the pre-bias control circuit according to one embodiment of the present invention.

One embodiment of the pre-bias control circuit 106 of FIG. 2 is shown in FIG. 3 where the slope measurement circuit 230 of FIG. 2 is a passive resistor-capacitor differentiator circuit including a differentiator capacitor 340 and a differentiator resistor (Rdiff) 342. The differentiator circuit is used to extract the slope of the output voltage 110. An offset voltage (Vofst) 348 is developed across the differentiator resistor 342 to prevent false tripping of the differentiator circuit. This offset voltage 348 can impose itself across the differentiator resistor 342 to develop a current source function that can be used to charge the differentiator capacitor 340. This current source function can further be used to command a controlled amount of pre-charge current that is adjustable by circuit parameter selection, which allows the switching power converter to operate with pre-bias conditions present.

Further, in FIG. 3, the slope detection circuit 232 of FIG. 2 is a non-inverting hysteresis comparator circuit. The operation of the non-inverting hysteresis comparator circuit is known in the art and, therefore, not described herein. The comparator circuit consists of a comparator 352 two resistors 344, 345 and a reference voltage (Vref) 346 and produces a hysteresis voltage (Vhys). The component values of the resistors 344, 345 and the reference voltage 346 are configured to act as a voltage divider such that the output is equal to the desired pre-defined threshold (Vofst) 348. In one embodiment, the pre-defined threshold is chosen for system requirements including but not limited to noise reduction, thermal sensitivities and the synchronous rectifier switch's response time. For example, the pre-defined threshold may be zero or a finite value determined by the magnitude of the switching power converter's noise. In another embodiment, the pre-defined threshold is set to limit the maximum pre-charge, second quadrant (negative) current flow in the switching power converter.

Considering the implementation of the pre-bias control circuit 106 of FIG. 3 and the reference numbers therein, the operation of the switching power converter is now described with reference to FIGS. 4a and 4b. FIG. 4a represents the waveform 407 generated by the switching control circuit 104 in a soft start mode. This is represented by the expanding duty cycle, D, 403 interval as a function of time. In normal operation, this waveform 407 would be controlled in such a manner as to ramp the switching power converter output voltage 110 as shown in FIG. 4b. If the output voltage 110 is monotonically rising 405, the output of the pre-bias control circuit 106 will not override the waveform 407 of the switching control circuit 104 in FIG. 4a.

Figure 5A:
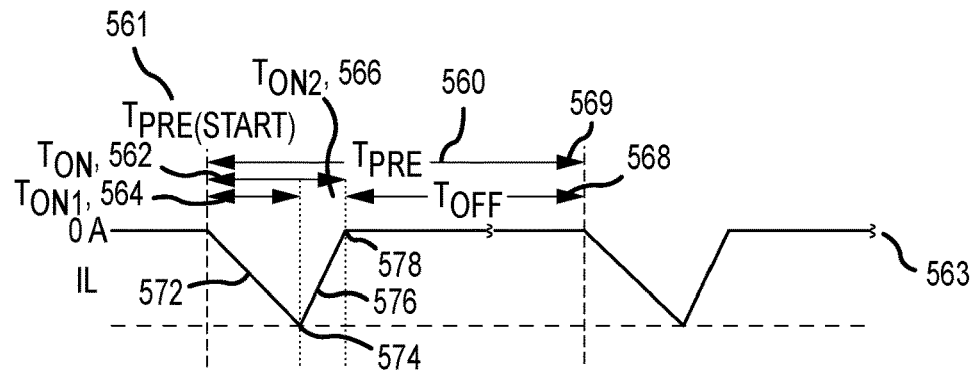
FIGS. 5a through 5e are waveform diagrams illustrating the pre-bias control circuit of FIG. 3 according to one embodiment of the present invention.
Figure 5B:
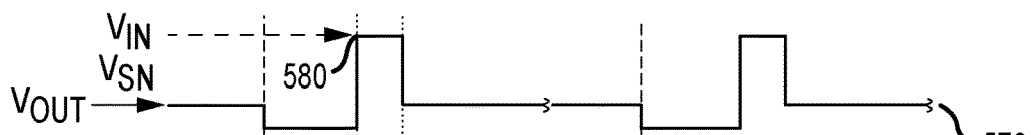
Figure 5C:
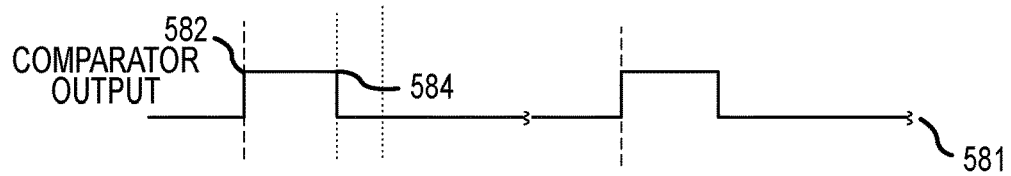
Figure 5D:
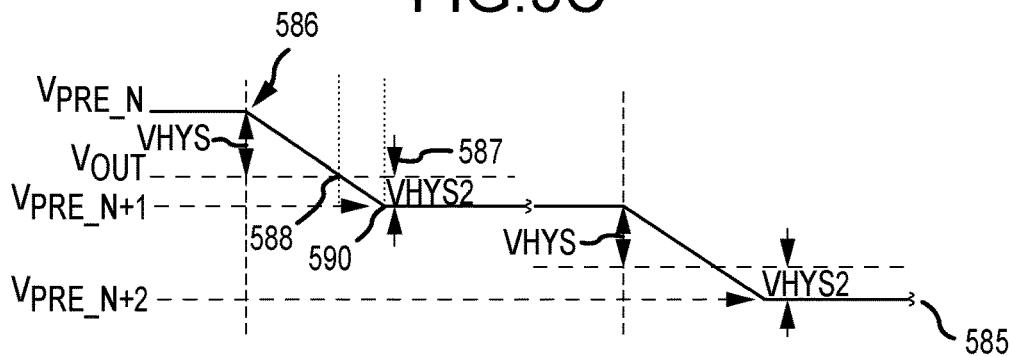
Figure 5E:
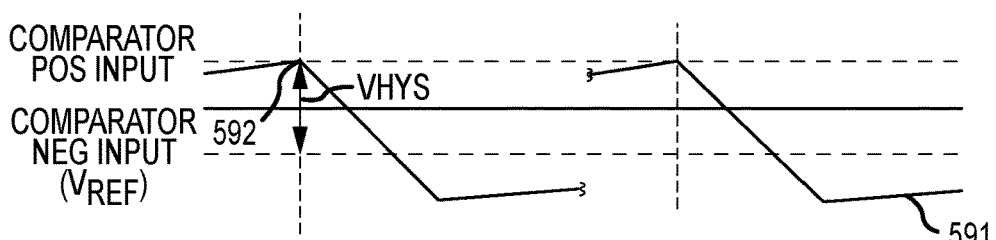

Still using the implementation of the pre-bias control circuit 106 in FIG. 3 and the reference numbers therein, refer to FIGS. 5a-e where FIG. 5a is the waveform 563 depicting the inductor's 122 pre-charge current 109, FIG. 5b is the waveform 570 depicting the voltage (Vsn) at the primary switch 112 output, FIG. 5c is the waveform 581 depicting the output of the comparator circuit (slope detection circuit), FIG. 5d is the waveform 585 depicting the output voltage 110 of the switching power converter over several cycles, and FIG. 5e is the waveform 591 depicting the voltage at the comparator's 352 positive input. Now consider the non-zero pre-bias voltage case where the output voltage 110 is greater than zero but lower than the steady state operating point of the switching power converter, and the duty cycle is near zero. In this case, the inputs to the comparator 352 have the positive input greater than the negative by the level of the offset voltage. As such, the output of the comparator 352 is a logic "1". The switching control circuit 104 will be LOW, the synchronous rectifier switch 116 will be commanded ON, and the rectifier gating circuit 234 will allow the waveform from switching control circuit 104 to pass. This grounds the left end of the inductor 122 and a pre-charge current 109 will build.

Due to the hysteretic nature of the pre-bias control circuit, the operation can be described in terms of various states. Within a set of operating conditions set by the switching power converter voltages and circuit values, a quasi-periodic function can be described and state variables within the period of operation can be found. On the initial cycle, the switching power converter must overcome the offset voltage but on subsequent cycles, the bounding control limits are set by the hysteresis value of the comparator circuit.

The number of cycles is illustrative in FIGS. 5a-e and is not indicative of the total number of cycles for a switching power converter. Cycles following the initial cycle are described in FIG. 5d as Vpre, Vpre_n, Vpre_n+1, and Vpre_n+2. On each cycle, the output voltage 110 will be discharged by a prescribed amount as determined by the circuit parameter values.

The following operation is described for cycles after the initial cycle where the pre-bias control circuit bounding limits are set by the hysteresis voltage 586. As shown in FIG. 5a, one pre-bias control circuit cycle (Tpre) 560 has a start (tprestart) 561 and an end (tpreend) 569. Tpre is split into two basic periods: the period (Ton) 562 the pre-bias control circuit 106 is allowing the switching control circuit 104 to control the synchronous rectifier switch 116 and the period (Toff) 568 the pre-bias control circuit 106 is overriding the switching control circuit 104 and commanding the synchronous rectifier switch 116 OPEN. Ton 562 is further broken into two modes—ton1 564 and ton2 566, described in detail below.

As shown in FIG. 5a, a pre bias control circuit cycle 560 begins at tprestart 561 when the comparator's positive input reaches the upper value (Vhys/2+Vref) 592 of the comparator circuit. This is a result of the differentiator capacitor 340 being charged by the effective current source developed by the offset voltage and the differentiator resistor (Vofst/Rdiff). As shown in FIG. 5a, the ton1 564 mode is now active and the pre-bias control circuit 106 is allowing the switching control circuit 104 to control the synchronous rectifier switch 116. Referring to FIGS. 5a, 5c, and 5d, the comparator's 352 output is a logic "1" 582 commanding the synchronous rectifier switch 116 CLOSED as the inductor's 122 pre-charge current 109 builds 572 while discharging 588 the output voltage 110. When the maximum pre-charge current 574 is reached, the comparator's 352 positive input reaches the minimum value of the comparator circuit (Vref−Vhys2) 590 and the comparator's output is a logic "0" 584 which causes the synchronous rectifier switch 116 to be commanded OPEN. This ends ton1 564 and starts the period ton2 566 which represents the reset time for the inductor 122. Due to flyback action, the energy stored in the inductor 122 during ton1 564 is returned to the input via the primary switch's ideal intrinsic body diode 114. This is shown in FIG. 5b by the primary switch output's voltage (Vsn) clamping to the voltage input source level 580. Since the voltage is reversed on the inductor 122 the pre-charge current 109 ramps down 576. Ton2 566 ends when the pre-charge current 109 in the inductor 122 reaches zero amps 578. Since interval ton2 566 represents charge extracted from the output capacitor 124, the output continues to discharge by a value of Vhys2 587 which is the undershoot voltage with respect to the output voltage 110 that occurs due to the reset of the inductor 122 and is equal to the pre-charge current 109 multiplied by the period ton2 566 divided by two times the value of the output capacitor 124. This becomes the starting point for the next cycle. As stated, toff 568 defines the period the pre-bias control circuit 106 is overriding the switching control circuit 104 and commanding the synchronous rectifier switch 116 OPEN. It is set by the time it takes for the positive input of the comparator 352 to return to the upper value (Vhys/2+Vref) 592 of the comparator circuit. The action that defines this period is due to the charging of the differentiator capacitor 340 by the effective current source (Vofst/Rdiff). At the conclusion of toff, one pre-bias control circuit cycle 560 completes at tpreend 569.

The described cycles of the pre-bias control circuit 106 repeat until either the output capacitor 124 is completely discharged or the duty cycle of the switching power converter is sufficiently high. Once this condition is achieved the switching control circuit 104 begins to command the primary switch 112 to a finite duty cycle developing a non-NEGATIVE slope of the output voltage 110 further causing the positive input of the comparator 352 to always be above the negative input; thus allowing the pre-bias control circuit to pass the switching control circuit 104 waveform to the synchronous rectifier switch 116 until the switching power converter is unable to maintain a monotonic output with a non-NEGATIVE slope then the pre-bias control circuit 106 will reactivate automatically.

Figure 6:
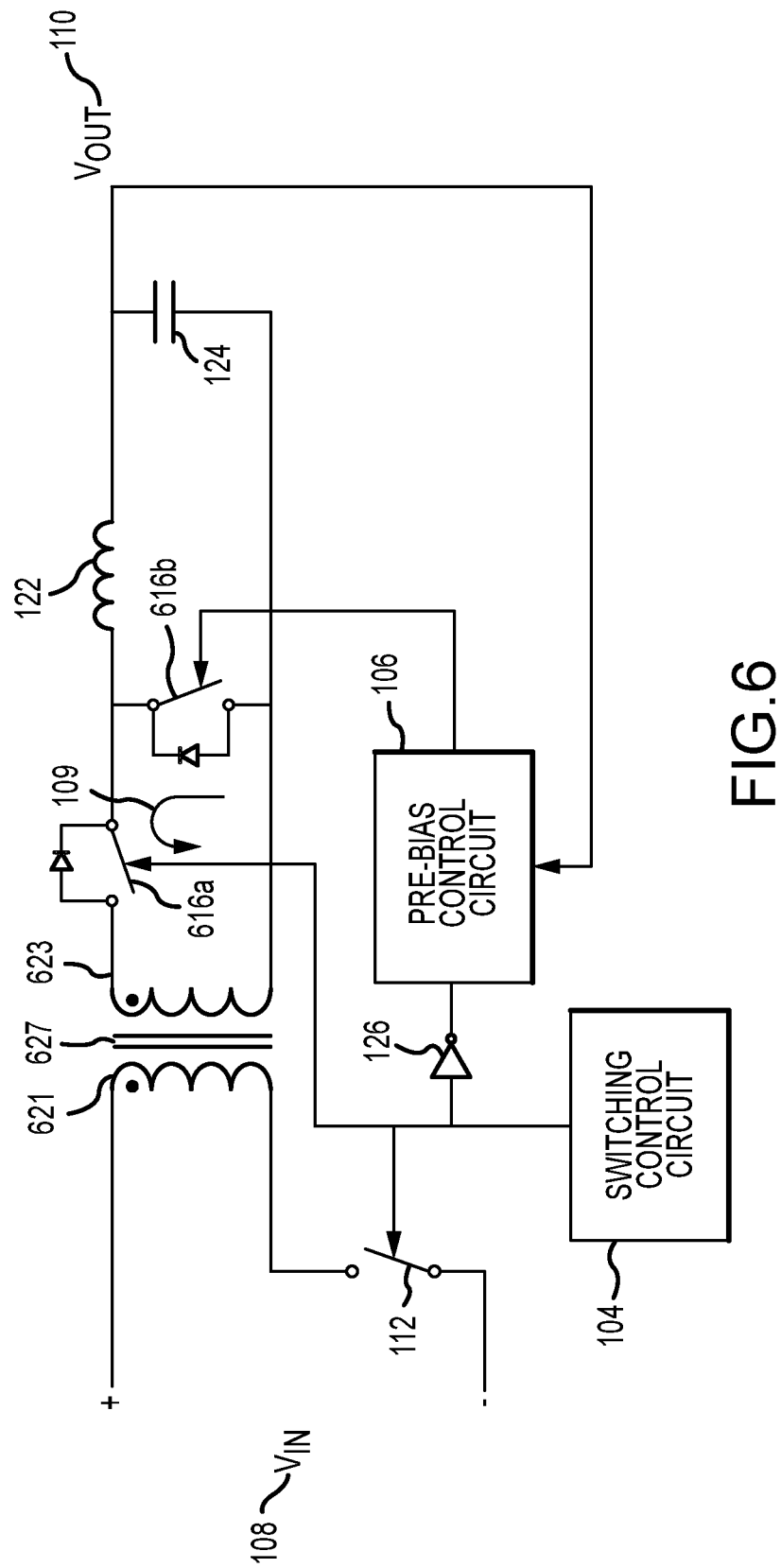
FIGS. 6 and 7 are diagrams of switching power converters according to other embodiments of the present invention.

The pre-bias control circuit 106 may be employed for any switching power converter topology utilizing synchronous rectifiers. For example, FIG. 6 is a schematic of a switching power converter topology commonly referred to as a forward converter including the pre-bias control circuit 106. The switching power converter of FIG. 6 includes two synchronous rectifiers 616a, 616b. The first synchronous rectifier switch 616a rectifies the voltage across the secondary winding 623 and the second synchronous rectifier switch 616b acts as the freewheeling rectifier. An output filter, comprising the output capacitor 124 and an inductor 122 filters the output voltage 110. In a forward converter, energy is transferred from the primary winding 621 to the secondary winding 623 of the transformer 627 during the CLOSED period of the primary switch 112. The operation of forward converters is known in the art and, therefore, not described herein. As shown in FIG. 6, the drive signal from the switching control circuit 104 to the pre-bias control circuit 106 may be inverted by an inverter because the synchronous rectifiers may alternatively conduct.

Figure 7:
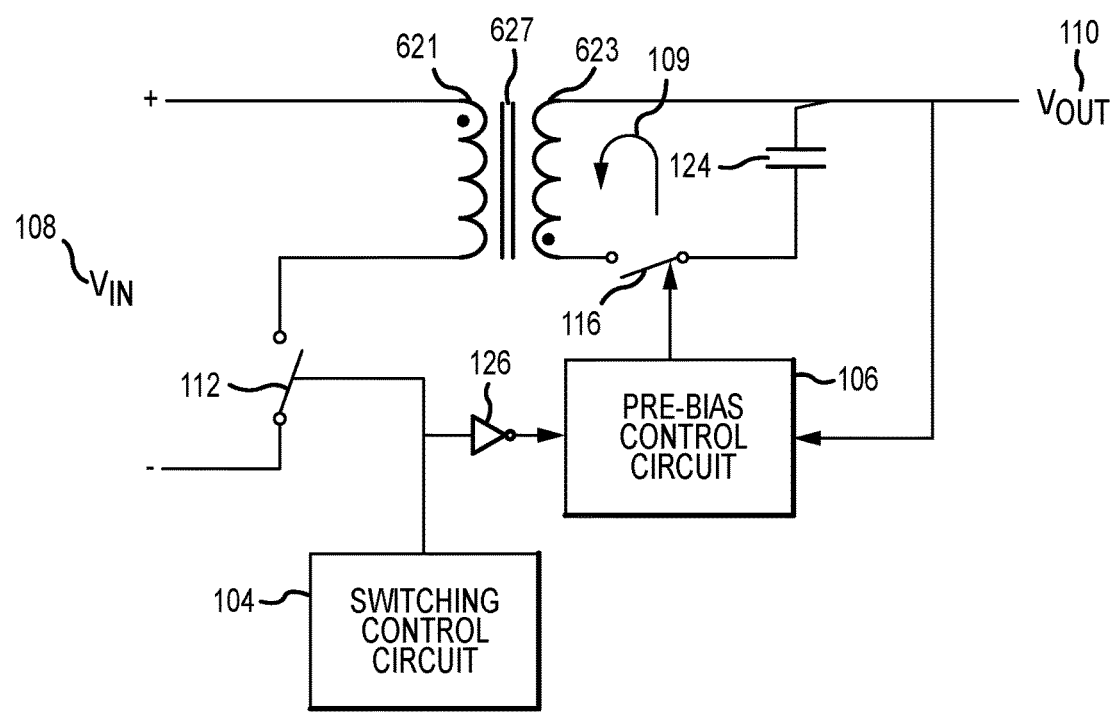

Another example of a different topology employing the pre-bias control circuit 106 is shown in FIG. 7. The switching power converter is in the flyback mode. A flyback converter stores energy from the input voltage 108 during the CLOSED period of the primary switch 112 and that energy is released to the output voltage 110 during the OPEN period of the primary switch 112. Energy stored in the output capacitor 124 is supplied to the output voltage 110 during the CLOSED period of the primary switch 112. The switching power converter includes a synchronous rectifier switch 116 coupled to the secondary winding of the transformer for rectifying the voltage across the secondary winding. The pre-bias control circuit 106 detects the slope of the output voltage 110 over time and produces an OPEN command when the slope detected is more NEGATIVE than a pre-defined threshold and the pre-charge current 109 has reached a maximum value, the synchronous rectifier switch 116 responds to the OPEN command and overrides the output of the switching control circuit 104 by commanding the synchronous rectifier switch 116 OPEN to prevent the synchronous rectifier switch 116 from conducting current in the second quadrant.

The flyback, forward and buck converters shown previously are examples of the types of switching power converters that may employ the pre-bias control circuit 106 and associated methods of the present invention. As stated previously, any switching power converter topology utilizing synchronous rectification may employ the pre-bias control circuit 106 method. This includes, but is not limited to; single ended and double-ended converters, half bridge and full bridge converters, integrated forward/flyback converter, etc. In addition, the pre-bias control circuit may be used to control multiple synchronous rectifiers in, for example, interleaved or multi-phased converters.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A switching power converter comprising:
    an energy storage section responsive to a selective application of an input voltage to produce an energy that provides an output voltage;
    a switching control circuit configured to produce a waveform that has a period and a duty cycle that set a value of the output voltage;
    a primary switch and a synchronous rectifier switch that during normal operation switch in opposition to each other responsive to the waveform such that when the primary switch is CLOSED and the synchronous rectifier switch is OPEN the energy storage section is charging and when the primary switch is OPEN and the synchronous rectifier switch is CLOSED the energy storage section is discharging; and
    a pre-bias control circuit configured to detect a slope of the output voltage over time and output an OPEN command when the slope detected is more NEGATIVE than a pre-defined threshold and a pre-charge current that flows back through the switching power converter has reached a maximum value, the synchronous rectifier switch further responsive to the OPEN command to override the waveform and OPEN the synchronous rectifier switch to control the energy from the output voltage from flowing back through the switching power converter.

2. The switching power converter of claim 1, wherein the pre-bias control circuit has an AND gate to determine controlling the synchronous rectifier switch.

3. The switching power converter of claim 1, wherein the pre-bias control circuit has a slope measurement circuit and a slope detection circuit configured to detect the slope of the output voltage.

4. The switching power converter of claim 1, wherein measurement of the slope includes amplification or filtering of the output voltage.

5. The switching power converter of claim 1, wherein the pre-defined threshold is set such that the pre-bias control circuit is controlled and non-responsive to noise.

6. The switching power converter of claim 1, wherein the switching control circuit is a pulse width modulator.

7. The switching power converter of claim 1, wherein the primary switch, the synchronous rectifier switch and the energy storage section are configured as a buck converter.

8. The switching power converter of claim 1, wherein the primary switch, the synchronous rectifier switch and the energy storage section are configured as a flyback converter.

9. The switching power converter of claim 1, wherein the primary switch, the synchronous rectifier switch and the energy storage section are configured as a forward converter.

10. The switching power converter of claim 1, wherein the primary switch, the synchronous rectifier switch and the energy storage section are configured as a boost converter.

11. The switching power converter of claim 1, wherein the pre-defined threshold is set by a comparator with a hysteresis voltage.

12. The switching power converter of claim 1, wherein the pre-defined threshold is set to limit the pre-charge current that flows back through the switching power converter to a maximum value.

13. A method of controlling a rate of change of an output voltage of a switching power converter in a pre-bias condition, comprising:
    detecting a slope of the rate of change of the output voltage;
    setting a pre-defined threshold voltage;
    comparing the slope to the pre-defined threshold voltage; and
    controlling a synchronous rectifier switch of the switching power converter such that when the slope detected is more NEGATIVE than the pre-defined threshold voltage and a pre-charge current that flows back through the switching power converter has reached a maximum value the synchronous rectifier switch is OPEN.

14. The method of claim 13, wherein the detecting step is accomplished with a differentiator circuit.

15. The method of claim 13, wherein comparing step is accomplished with a comparator circuit.

16. The method of claim 13, wherein the switching power converter further comprises a primary switch, the synchronous rectifier switch and an energy storage section configured as a buck converter.

17. The method of claim 13, wherein the switching power converter further comprises a primary switch, the synchronous rectifier switch and an energy storage section configured as a flyback converter.

18. The method of claim 13, wherein the switching power converter further comprises a primary switch, the synchronous rectifier switch and an energy storage section configured as a forward converter.

19. The method of claim 13, wherein the switching power converter further comprises a primary switch, the synchronous rectifier switch and an energy storage section configured as a boost converter.

20. The method of claim 13, wherein the pre-defined threshold voltage is set by a comparator with a hysteresis voltage.

21. The method of claim 13, wherein the pre-defined threshold voltage is set to limit the pre-charge current that flows back through the switching power converter to a maximum value.

22. The method of claim 13, wherein the measuring step further comprises amplifying or filtering the slope of the output voltage.

\* \* \* \* \*